Oct. 9, 1951 H. A. ROBINSON 2,570,715
AUTOMATIC GAIN CONTROL CIRCUIT
Filed March 20, 1948
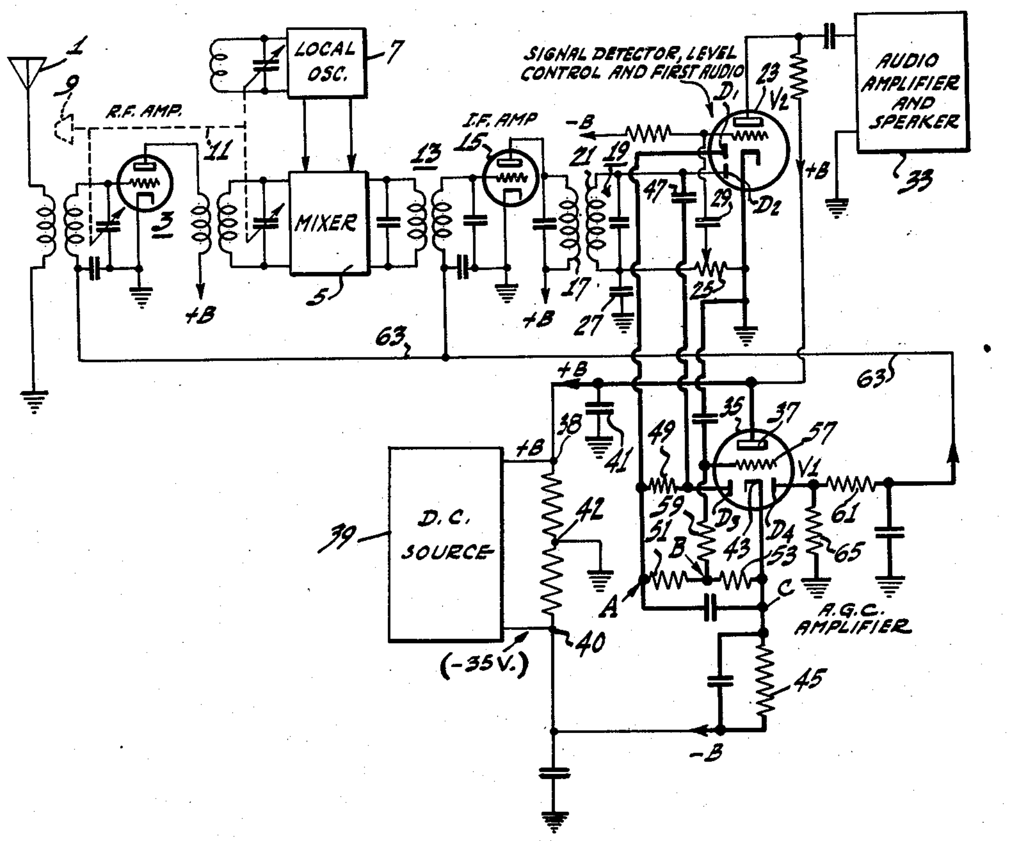
INVENTOR
HARRIS A. ROBINSON
BY Philip E. Hooper
ATTORNEY Patented Oct. 9, 1951 2,570,715

UNITED STATES PATENT OFFICE 2,570,715

AUTOMATIC GAIN CONTROL CIRCUIT

Harris A. Robinson, Philadelphia, Pa., assignor to Radio Corporation of America, a corporation of Delaware Application March 20, 1948, Serial No. 16,053

6 Claims. (Cl. 250—20)

This invention relates to automatic gain control (AGC) circuits for radio receivers, and more particularly to an improved apparatus and means for controlling the gain of a high frequency amplifier to maintain a substantially uniform amplified carrier intensity level.

It is well known to those skilled in the art that the most desirable automatic gain control characteristic is one in which maximum amplifier gain is available for signals which are too weak to produce the desired operating voltage at the second detector; and which develop a very large gain control voltage when the received signal is of sufficient intensity to exceed the desired operating voltage at the second detector, so that the amplitude of the signal at the detector is thereafter maintained at a constant value. By delaying the application of the AGC voltage until a signal of predetermined strength has been received, it will be appreciated that the amplification of weak signals is not reduced and thus the sensitivity of a receiver to weak signals is not destroyed.

To provide satisfactory operation when very strong signals are received, the AGC system must develop a control bias of sufficient amplitude to reduce the gain of the amplifier stage to "cut off" or to a very low value. The actual amplitude, of course, depends upon the operating characteristics of the tubes employed. In general it has been found that a gain control voltage of the order of $-35$ volts is sufficient. It is therefore an important object of this invention to provide an AGC circuit which produces a control voltage of sufficient amplitude to greatly decrease the transconductance of amplifier tubes commonly employed in amplifier circuits.

Conventional diode rectifier circuits which have been employed heretofore produce a gain control voltage which is approximately directly proportional to the amplified carrier; hence the AGC characteristic is not flat unless a large number of amplifier tubes are controlled. It is, therefore, an important object of this invention to overcome the disadvantages of previously known systems and to provide one in which, for signals below the threshold or relay level, no AGC voltage is produced, and for signals equal to or above the threshold level the AGC voltage rises very rapidly to a maximum value, the maximum control voltage amplitude being reached as soon as the carrier amplitude exceeds the threshold voltage by a very small amount, of the order of a few volts.

In accordance with the present invention, a direct current amplifier of the cathode follower type is used to amplify the AGC voltage developed by a diode rectifier. The cathode of the amplifier is connected through a resistor to a point of fixed potential which is highly negative with respect to the cathodes of the controlled amplifiers. For signal levels below the threshold amplitude, the cathode follower amplifier carries full output current so that the cathode rises to a positive value. The AGC voltage is derived from a diode anode associated with the cathode follower cathode. So long as the cathode is positive no AGC voltage is developed. As the output current of the cathode follower amplifier is reduced, the cathode potential becomes more negative until it becomes negative with respect to the associated diode anode, at which point the AGC voltage begins. At cut-off, the cathode reaches the potential of the fixed negative source, and maximum AGC voltage is produced. The output current of the cathode follower amplifier is controlled by a D. C. voltage obtained by rectifying the amplified carrier.

The threshold point could, of course, be adjusted to any desired value by applying a suitable bias to the diode anode, either positive or negative, so as to determine the point at which its potential exceeded that of the cathode as the cathode moved through a predetermined range from its most positive value to its most negative value. It has been found, however, that such a method reduces the available useful range of the AGC voltage. It is, therefore, a further important object of the invention to overcome this difficulty and to provide an AGC system in which the full range of control voltage is available for any desired threshold or delay. This desirable characteristic is obtained, in accordance with the present invention, by delaying the operation of the cathode follower amplifier itself, so that maximum output current flows through the amplifier until the amplified signal reaches the threshold amplitude at which the AGC action is to begin, any increase in carrier amplitude at the second detector thereafter causing the cathode follower amplifier to come into operation to develop almost instantly a large AGC voltage which effectively maintains the carrier amplitude at a constant level.

As a result of the mode of operation made possible by the present invention, it is possible to use a high $\mu$ amplifier tube as the AGC amplifier, thus making available an AGC voltage of greatest amplitude and having other desirable features as will appear more fully hereinafter.

It is therefore a further object of the present invention to provide an amplified AGC circuit in which the operation of the amplifier and consequently of the associated diode anode is delayed until the carrier amplitude at the second detector reaches a desired threshold value.

A still further object of this invention is to provide an AGC circuit having a direct current amplifier and an associated diode anode for developing an automatic gain control voltage, and which includes means for maintaining both the AGC amplifier and the diode anode unresponsive to the amplified carrier until the carrier exceeds a predetermined amplitude.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing which is the circuit diagram of a preferred embodiment of the invention.

Referring to the drawing, there is shown merely by way of illustration a superheterodyne type of radio receiver, those portions of the receiver which are not per se a part of the present invention being shown in simplified form. Thus, antenna 1 is coupled to the input circuit of a tuned radio frequency amplifier 3. The output of the amplifier is coupled to the preferably tuned input circuit of mixer or first detector 5, which has impressed on it the output from local oscillator 7, which also includes a tunable circuit in accordance with conventional practice. The various resonant circuits may all be controlled by a common tuning mechanism 9, as indicated by the dotted line.

The mixer output is a fixed intermediate frequency (I. F.) and is applied by a fixedly tuned I. F. transformer 13 to the input of I. F. amplifier tube 15, and similarly in sequence to as many additional I. F. stages as may be desired, only one stage, however, having been illustrated. The output of the last I. F. amplifier is applied by means of primary winding 17 to the resonant input circuit 19 of the second detector. Thus one terminal of secondary 21 is connected to diode anode $D_2$ of a double diode-triode detector and first audio amplifier tube 23, while the other terminal is connected to the grounded cathode of this tube through resistor 25 and is also bypassed to ground for radio frequency currents by capacitor 27. The rectified audio frequency voltage developed across resistor 25 is applied to the grid of audio amplifier tube 23 by means of a variable tap on resistor 25 and coupling capacitor 29. Output is derived from the plate electrode and applied to any suitable audio amplifier and speaker 33.

It will be appreciated that the circuit so far described is entirely conventional, and need not be explained in further detail.

The circuit embodying the amplified AGC system of the present invention is shown in heavy lines and will be described in detail.

A second double diode-triode 35 and its associated circuit element, including the diode-anode $D_1$ of the tube 23, comprise the AGC system. Plate 37 is connected directly to the positive terminal 38 of a suitable D. C. source 39, and may be bypassed to ground by capacitor 41. Cathode 43 is connected to terminal 40 of a suitable source of negative potential provided by source 39, through resistor 45. It is to be understood that the polarity of the voltage available at terminal 40 is negative with respect to that of terminal 38, and also with respect to an intermediate point 42, the latter preferably being considered as ground potential. However, the point at which ground is connected is immaterial so long as the relative polarities indicated are maintained. It is preferred to connect the intermediate point 42 to ground since this is the D. C. potential of the cathodes of the controlled amplifiers, and it is customary to connect the cathodes directly to ground or "chassis." Thus, as herein employed, "ground potential" is merely the selected reference potential with respect to which all other potentials in the system are measured.

The first diode anode $D_3$ functions as the AGC rectifier or input diode, and is coupled to the I. F. transformer secondary 21 by coupling capacitor 47. The D. C. return path for this diode anode is completed by series connected resistors 49, 51 and 53, the latter terminating at cathode 43. Bypass capacitor 55 is connected across the two latter resistors. The junction (point A) of resistors 49 and 51 is connected to the second diode anode $D_1$ of tube 23.

Grid 57 is connected to the junction (point B) of resistors 51 and 53 through a coupling resistor 59. The grid may also be bypassed to ground. The second or AGC output diode anode $D_4$ of the AGC amplifier tube 35 is connected through isolating or filter resistor 61 to the low potential terminals of the controlled amplifiers by lead 63, in accordance with conventional practice, since the AGC voltage is derived from this anode. Output diode anode $D_4$ is also connected to ground by resistor 65.

The operation of the above circuit is as follows:

By reason of the unidirectional conductivity between cathode 43 and anode $D_3$ of the AGC amplifier discharge device 35, and the associated resistors interconnecting them, a direct or unidirectional voltage is developed across resistors 51 and 53, the direction of current flow being such that point A tends to become negative with respect to the cathode (point C). Neglecting for a moment the effect of diode anode $D_1$, the amplitude of this voltage will be approximately directly proportional to the amplitude of the applied radio frequency carrier.

Since the D. C. component of the rectified and filtered current is applied directly to grid 57, it will be appreciated that in the no-signal condition, that is, when no radio frequency voltage is applied to the rectifier, no bias is developed by the signal and the grid 57 will be at a fixed slightly negative potential (with reference to the cathode) for reasons that will appear below.

Consequently, a large D. C. current flows through the output circuit of the amplifier triode section which includes resistor 45, the direction of this current being such that the cathode (point C) assumes a positive value with respect to terminal 40, determined primarily by the plate voltage employed, the value of resistor 45 and the tube characteristics. Terminal 40 is at a negative potential which exceeds the maximum control bias required by an amount determined by the voltage drop from anode $D_4$ to cathode 43 when current is flowing between them. For example, terminal 40 may be at a potential of −35 volts with respect to ground, or point 42, to which the cathodes of the controlled tubes are connected. The plate voltage and/or the value of resistor 45 are selected so that, in the no-signal condition, cathode 43 rises to a potential somewhat more positive than ground, say +6 volts. As a result, no current can flow between anode $D_4$ and the associated cathode, and no AGC voltage is developed. The receiver is, therefore, operating at maximum sensitivity, ready to respond to even the weakest signal that may be tuned in.

Consider now the function of anode $D_1$ in the no-signal condition. The cathode of tube 23 which is associated with anode $D_1$ is at ground potential. The anode itself, however, is connected to cathode 43 of the AGC amplifier tube which, as stated above, is at a potential of about +6 volts. Consequently, current flows from anode $D_1$ to its cathode which pulls the potential of this anode down to a value substantially equal to the potential of the cathode. Actually, anode $D_1$ will have a potential of about −0.7 volt due to the effect of contact potential. Diode anode $D_3$ is connected to point A by resistor 49. Consequently there will be an effective "delay" bias of 6.7 volts between anode $D_3$ and cathode 43.

Resistors 51 and 53 comprise a voltage divider. If the two are of equal value, as in a typical application, say 470,000 ohms, the effective cathode-grid voltage of the AGC amplifier tube will be −3.35 volts. This is the fixed, no-signal value referred to above, the plate voltage and cathode resistance being so selected that with this effective bias the cathode 43 has the stated potential.

Suppose, now, a weak signal is tuned in, the amplified value of which at the detector diode anode $D_2$ is still below the desired value for best operation, even with maximum receiver gain. This signal will not be rectified by the AGC input diode because it is held by anode $D_1$ at a potential which is negative with respect to its associated cathode 43. Consequently, the fixed bias on grid 57 of the AGC amplifier remains substantially unchanged, that is, the "delay" action is effectively applied to the direct current amplifier portion of tube 35.

If the amplitude of the carrier is now increased, at some "threshold" value the signal will be sufficient to overcome the delay bias on diode anode $D_3$, and the resulting rectification will drive point A to a more negative value. The "holding" action of diode anode $D_1$ then stops, since it is now at a negative potential with respect to its cathode. The triode grid 57 simultaneously becomes more negative and reduces the triode output current. Consequently, the potential of the triode cathode 43 becomes less positive. As it reaches a value approximately equal to the potential of AGC anode $D_4$, current flows from the latter in such a direction as to develop a small negative AGC voltage across resistor 65. The AGC action and the control of the direct current amplifier essentially begin together. This is very important for reasons which will appear more fully hereinafter.

As the carrier amplitude increases beyond the threshold or delay point, the AGC voltage increases very rapidly. When sufficient rectified voltage is developed to cut off the direct current amplifier, the cathode 43 will be substantially at −35 volts, and the AGC potential will be driven down to a similar value. After cut-off is reached, further increase of carrier amplitude produces no further increase in the AGC voltage. However, when the AGC voltage is applied to the carrier amplifier stages, the resulting reduction in gain will substantially completely overcome the high signal level and will maintain the carrier at the second detector at the desired threshold value. In considering the operation above it is assumed that the AGC lead 63 is disconnected from the controlled amplifier stages so that a carrier of variable amplitude can be applied to the second detector for the purpose of determining the response characteristic.

It will now be apparent that since both the rectifier anode $D_3$ and the D. C. amplifier grid 57 are delayed in action, the triode section of tube 35 may be of the high $\mu$ variety. That is, the more rapidly the tube approaches cut-off as the negative grid bias is increased, the better the AGC control. On the other hand, if the delay action was produced by biasing AGC anode $D_4$ to a no-signal potential negative with respect to cathode 43, and no delay action was applied to the triode itself, it may be seen that it would be impossible to employ a high $\mu$ triode. In such case the triode might well be partially or fully cut-off by the rectified carrier before the signal reached the desired amplitude. To obtain the maximum range of AGC voltage, it is therefore very important that the control bias be applied to the triode grid after the threshold amplitude of the carrier has been reached. This can only be accomplished when, in accordance with the present invention, the delay action is effective to delay the development of a control bias for the triode itself.

It will be appreciated by those skilled in the art, that since the output of the AGC amplifier is developed across an impedance in the cathode circuit, that the amplifier is of the so-called "cathode-follower" type.

The AGC voltage vs. carrier input curve (assuming the AGC lead to be disconnected so that a carrier of uniformly increasing amplitude can be applied to the second detector) will have its greatest slope when the full rectified voltage developed by anode $D_3$ is applied to the amplifier grid 57. This would be accomplished by connecting grid 57 to anode $D_3$, or to Point A. However, this would increase the no-signal fixed bias on the grid and would necessitate increasing the plate voltage appreciably to obtain the full range of output. A practical design must, therefore, usually compromise maximum response slope with practical voltages which are readily available. Reducing the no-signal bias to a value of the order of −3.35 volts by making resistors 51 and 53 each equal to 470,000 ohms, for example, provides an adequate range with a plate voltage of the order of +250 volts which is readily available in radio receivers. In any event, the slope, even under such a compromise, is far steeper than that obtained by any previously known system, and the resulting AGC control maintains the carrier level substantially constant at the second detector.

The threshold or delay point at which the AGC voltage is developed may be adjusted to the desired value by any method which will control the no-signal potential of cathode 43. This may include adjustment of either the positive or the negative voltages available at terminals 38 and 40, respectively, or the adjustment of ground point 42. The value of cathode resistor 45 may also be varied since, for a given maximum output current, the cathode potential is determined by the IR drop in this resistor. The threshold point may also be controlled by varying no-signal bias on grid 57 as by adjusting the relative values of resistors 51 and 53. Any of these methods may be employed, or a combination of several of them, as will be understood by those skilled in the art.

What is claimed is:

1. In a system for developing a delayed automatic gain control voltage for controlling the gain of a signal amplifier, the combination of means including a rectifier coupled with said amplifier for rectifying the signal output of said signal amplifier, a rectifier load circuit connected to said rectifier, a direct current amplifier connected to said rectifier load circuit for amplifying the rectified output voltage, and a further rectifier connected in shunt with said rectifier load circuit for maintaining said rectifying means and said direct current amplifier unresponsive to said signal output until said signal output exceeds a predetermined amplitude.

2. In a system for developing a delayed automatic gain control voltage for controlling the gain of a signal amplifier, the combination of means for rectifying the signal output of said signal amplifier; a cathode follower direct current amplifier for amplifying the rectified output voltage, means including a diode comprising an anode and the cathode of said cathode follower amplifier for deriving an automatic gain control voltage; and a separate diode connected in shunt with said rectifying means for maintaining said cathode follower amplifier unresponsive to said signal output until said signal output exceeds a predetermined amplitude.

3. In a system for developing a delayed automatic gain control voltage for controlling the gain of a signal amplifier, the combination of means for rectifying the signal output of said signal amplifier; a cathode follower direct current amplifier having a control electrode energized by the rectified direct current component of said signal voltage; means including a diode comprising an anode and the cathode of said cathode follower amplifier for deriving a delayed automatic gain control voltage for said signal amplifier; and a separate diode rectifier connected in shunt with said rectifying means and responsive to the signal output of said signal amplifier for maintaining said rectifier means and said direct current amplifier unresponsive to said signal output until said signal output exceeds a predetermined amplitude.

4. In a system for developing a delayed automatic gain control voltage for controlling the gain of a signal amplifier including at least one discharge device having a cathode maintained at a fixed reference potential and a grid, the combination of a cathode follower direct current amplifier having cathode, control grid and plate electrodes; means connecting said plate electrode to a source of potential which is positive with respect to said reference potential; means including a first resistor connecting said cathode to a source of potential which is negative with respect to said reference potential; a first diode including an anode and said direct current amplifier cathode; means for applying the output of said signal amplifier between said direct current amplifier cathode and said first diode anode; a second resistor connecting said direct current amplifier cathode and said first diode anode; a direct current connection including a third resistor connected between said control grid and a point on said second resistor; a second diode including an anode and said direct current amplifier cathode and connected by a direct current path to the grid of said discharge device; and an additional diode having a cathode maintained at said fixed reference potential and a diode anode connected to the first diode anode end of said second resistor.

5. A signal channel including a variable gain amplifier whose gain may be varied by a gain control voltage; a first rectifier having cathode and anode electrodes and coupled to the output of said signal channel for developing a direct current voltage across a first resistor; a direct current amplifier having cathode, grid and plate electrodes, said rectifier and amplifier cathodes having a common path including a second resistor; means for applying a positive potential to said plate electrode; a direct current connection between said grid and said first resistor; a second rectifier having cathode and anode electrodes, said last named cathode being maintained at the same potential as said first named cathodes; means for deriving a gain control voltage from the anode of said second rectifier; means for applying said gain control voltage to said variable gain amplifier to control the gain thereof, a third rectifier having cathode and anode electrodes, said last named cathode being maintained at a fixed potential and a direct current connection between the anode of said third rectifier and said first resistor for maintaining said grid and the anode of said second rectifier at predetermined potentials with respect to the potential of said cathodes until the amplitude of the signal voltage exceeds a predetermined value.

6. In a radio receiver having a signal channel for modulated radio frequency currents which includes a variable gain radio frequency amplifier, means for developing a modulation frequency voltage and a modulation frequency output circuit, the combination of a discharge device having cathode, grid, plate and a pair of diode anode electrodes; means coupled to said radio frequency amplifier including one of said diode anodes and a direct current path between said diode anode and said cathode for rectifying said radio frequency currents; means for applying the direct current component of said rectified currents to said grid electrode; a source of voltage having its positive terminal connected to said plate electrode; a resistor connected between said cathode and the negative terminal of said source; a direct current connection between the other diode anode and the gain varying circuit of said radio frequency amplifier for controlling the gain thereof; and an additional diode having an anode and a cathode and connected to a point on said direct current path, the potential of said last-named cathode being at a fixed potential which is negative with respect to the no-signal potential of the cathode of said discharge device.

HARRIS A. ROBINSON.

REFERENCES CITED

The following references are of record in the file of this patent:

UNITED STATES PATENTS

| Number | Name | Date |
|---|---|---|
| 2,018,982 | Travis | Oct. 29, 1935 |
| 2,073,486 | Koch | Mar. 9, 1937 |
| 2,171,657 | Klotz | Sept. 5, 1939 |
| 2,200,049 | Van Loon | May 7, 1940 |